United States Patent [19]

Saito et al.

[11] Patent Number: 5,172,336

[45] Date of Patent: Dec. 15, 1992

[54] METHOD OF TRANSFERRING BLOCH LINES

[75] Inventors: Fumihiko Saito, Sagamihara; Takeo Ono, Atsugi; Hitoshi Oda; Akira Shinmi, both of Yokohama, all of Japan

[73] Assignee: Canon Kabushiki Kaisha, Tokyo, Japan

[21] Appl. No.: 734,098

[22] Filed: Jul. 23, 1991

Related U.S. Application Data

[63] Continuation of Ser. No. 633,177, Dec. 28, 1990, abandoned, which is a continuation of Ser. No. 214,051, Jun. 29, 1988, abandoned.

[30] Foreign Application Priority Data

Jul. 6, 1987 [JP] Japan .................. 62-166987

[51] Int. Cl.$^5$ ............................. G11C 19/08
[52] U.S. Cl. ........................... 365/87; 365/29
[58] Field of Search .................... 365/29, 87

[56] References Cited

U.S. PATENT DOCUMENTS

| | | | |
|---|---|---|---|
| 3,887,905 | 6/1975 | Bobeck et al. ........... | 365/29 |
| 4,128,895 | 12/1978 | Almasi et al. ........... | 365/11 |
| 4,583,200 | 4/1986 | Konishi et al. ........... | 365/29 |
| 4,589,094 | 5/1986 | Takeuchi et al. ........... | 365/36 |
| 4,692,899 | 9/1987 | Lo et al. ........... | 365/29 |
| 4,731,752 | 3/1988 | Hidaka ........... | 365/29 |
| 4,974,200 | 11/1990 | Ono et al. ........... | 365/29 |
| 4,974,201 | 11/1990 | Ono et al. ........... | 365/29 |

FOREIGN PATENT DOCUMENTS

| | | | |
|---|---|---|---|
| 0106358 | 4/1984 | European Pat. Off. . | |
| 3542279 | 6/1986 | Fed. Rep. of Germany . | |
| 96592 | 6/1984 | Japan ................... | 365/29 |
| 76079 | 4/1985 | Japan ................... | 365/29 |
| 113389 | 6/1985 | Japan . | |

OTHER PUBLICATIONS

Patent Abstracts of Japan, Kokai No. 59-098373, vol. 8, No. 214, Sep. 29, 1984.
Patent Abstracts of Japan, Kokai No. 62-089295, vol. 11, No. 298, Apr. 23, 1987.
Suzuki, et al., "Chip Organization of Bloch Line Memory", EIII Transactions on Magnetics, vol. 22, No. 5, Sep. 1985, pp. 784–789.
Humphrey, et al., "Vertical Bloch Line Memory", EIII Transactions on Magnetics, vol. Mag. 21, No. 5, Sep. 1985.
Hidaka, "Charged Wall Formation and Propagation Analysis in Ion–Implanted Contiguous Disk Bubble Devices", J. Appl. Phys., vol. 53, No. 8, Aug. 1982, pp. 5815 through 5822.
H. Matsutera, et al., "Vertical Bloch Line Pair Operation By In-Plane Field for Bloch Line Memory", IEEE Transactions on Magnetics, vol. Mag.-22, No. 5, Sep. 1986, pp. 793-795.
Hidaka et al., "Bloch Line Stabilization in Stripe Domain Wall for Bloch Line Memory", IEEE Transactions on Magnetics, Sep., 1984, pp. 1135-1137.

*Primary Examiner*—Joseph L. Dixon
*Assistant Examiner*—Jack A. Lane
*Attorney, Agent, or Firm*—Fitzpatrick, Cella, Harper & Scinto

[57] ABSTRACT

A transfer method for transferring Bloch lines present in the magnetic wall of a magnetic section formed in a magnetic thin film along the magnetic wall includes the steps of distributing a predetermined soft magnetic material layer pattern on the magnetic thin film, applying a magnetic field to the soft magnetic material layer pattern parallel to the film surface of the magnetic thin film to form a potential well in the magnetic thin film, positioning the Bloch lines in the potential well, and varying the direction of the magnetization of the soft magnetic material layer pattern in a plane parallel to the film surface to move the potential well along the magnetic wall and transfer the Bloch lines.

35 Claims, 4 Drawing Sheets

METHOD OF TRANSFERRING BLOCH LINES

This application is a continuation of application Ser. No. 07/633,177 filed Dec. 28, 1990, now abandoned, which is a continuation of application Ser. No. 07/214,051 filed Jun. 29, 1988, now abandoned.

BACKGROUND OF THE INVENTION

1. Field of the Invention

This invention relates to a method of transferring Bloch lines present in the magnetic wall of a magnetic section formed in a magnetic thin film along the magnetic wall.

2. Related Background Art

Today, various memory devices, such as magnetic tapes, Winchester discs, floppy discs, optical discs, magneto-optical discs and magnetic bubble memories, are used as memories such as outside memories for computers, memories for an electronic file and memories for a still picture file. Among these memory devices, memories other than magnetic bubble memories require the recording-reproducing head to be moved relative to the memory during the recording and reproduction of information. That is, with such relative movement of the head, rows of information are fixedly recorded on information tracks by the head or rows of information fixedly recorded on the information tracks are reproduce by the head.

However, as a higher degree of recording density has been gradually required in recent years, there have arisen various problems. That is, tracking control for causing the head to accurately follow the information tracks has become complicated, the quality of recorded and reproduced signals has deteriorated, because of the control being insufficient, the quality of recorded and reproduced signals has deteriorated by vibration of the head moving mechanism or by dust or the like adhering to the surface of the memory, and further, in the case of a memory in which recording and reproduction are effected with the head being in contact with a magnetic tape or the like, abrasion has been caused by sliding. In the case of a memory, such as an optical disc in which recording and reproduction are effected with the head being in non-contact with the disc, highly accurate focusing control for focusing has become necessary, and the quality of recorded and reproduced signals has deteriorated because of the control being insufficient.

On the other hand, the magnetic bubble memory, as shown in the applicant's U.S. application Ser. No. 801,401 filed Nov. 25, 1985 now abandoned, can effect recording of information at a predetermined position and transfer the recorded information and can reproduce the information at a predetermined position while transferring the information and therefore, does not require relative movement of the head during recording and reproduction. Therefore, it does not pose the problems noted above, even when increasing the recording density in degree, and it can realize high reliability.

However, the magnetic bubble memory uses, as information bits, circular magnetic sections (bubbles) created by applying a magnetic field to a magnetic thin film, such as a magnetic garnet film having a readily magnetizable axis in a direction perpendicular to the film surface thereof and therefore, even if use is made of a minimum bubble (diameter 0.3 μm) limited from the material characteristic of the present-day garnet film, several tens of M bits/cm$^2$ is the limit of the recording density and a higher degree of recording density is difficult to realize.

So, recently, attention has been paid to a Bloch line memory as a memory having a recording density exceeding the limit of the recording density of the above-described magnetic bubble memory. This Bloch line memory, as shown in U.S. Pat. No. 4,583,200, uses, as information, bits of a pair of Neel magnetic wall structures (Bloch lines) interposed between Bloch magnetic wall structures existing around a magnetic section created in a magnetic thin film and therefore, it permits the recording density to be increased by approximately two factors as compared with the above-described magnetic bubble memory. For example, when use is made of a garnet film of a bubble diameter of 0.5 μm, a recording density of 1.6 G bits/cm$^2$ can be achieved.

Figure 1:
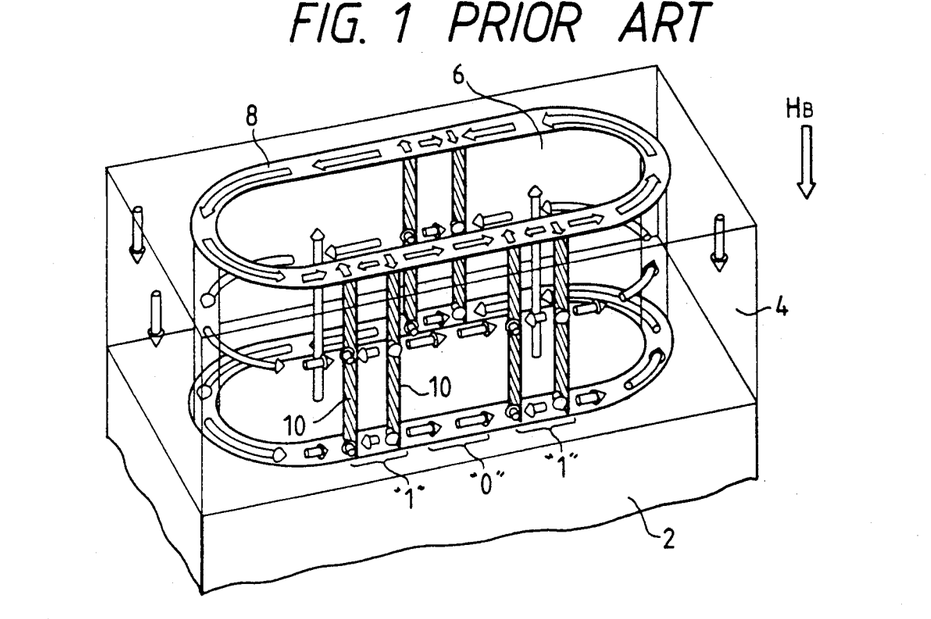
FIG. 1 is a schematic perspective view of a prior art magnetic material structure constituting a Bloch line memory.

FIG. 1 of the accompanying drawings shows a schematic perspective view of an example of the magnetic material structure constituting a Bloch line memory.

In FIG. 1, reference numeral 2 designates a substrate formed of non-magnetic garnet such as GGG or NdGG, and a magnetic garnet thin film 4 is provided on the substrate 2. The film 4 can be formed, for example, by a liquid phase epitaxial growing method (LPE method), and the thickness thereof is, for example, of the order of 5 μm. Reference numeral 6 denotes a stripe-like magnetic section formed in the magnetic garnet thin film 4, and a magnetic wall 8 is formed as a boundary with the other area of the magnetic section 6. The width of the stripe-like magnetic section 6 is, for example, of the order of 5 μm, and the length thereof is, for example, of the order of 100 μm. The thickness of the magnetic wall 8 is, for example, of the order of 0.5 μm. As indicated by arrows, the direction of magnetization in the magnetic section 6 is upward while, on the other hand, the direction of magnetization outside the magnetic section 6 is downward.

The direction of magnetization in the magnetic wall 8 rotates as if it were gradually twisted from the inner surface (i.e., the surface adjacent to the magnetic section 6) side toward the outer surface side. The direction of this rotation is converse on opposite sides of the magnetic wall 8 with Bloch lines 10 present vertically in the magnetic wall 8 as the boundary. In FIG. 1, the direction of magnetization in the central portion in the thickness direction of the magnetic wall 8 is indicated by arrows, and the direction of magnetization in the Bloch lines 10 is likewise indicated.

A downward bias magnetic field $H_B$ is applied from the outside to the magnetic material structure, as described above.

As shown, there are two kinds of Bloch lines 10 differing in the direction of magnetization, and the presence and absence of a pair of Bloch lines are made to correspond to information "1" and information "0", respectively. A pair of Bloch lines exist in potential wells formed at a certain period along the magnetic wall 8. Also, a pair of Bloch lines are successively transferred to the adjacent potential well by applying a pulse magnetic field perpendicular to the surface of the substrate. Thus, recording of information into the Bloch line memory (writing of the pair of Bloch lines into the magnetic wall 8) and reproduction of the information recorded in the Bloch line memory (reading-out of the pair of Bloch lines in the magnetic wall 8) can be accomplished at respective predetermined positions, while the pair of Bloch lines are transferred in the magnetic wall 8. The recording and reproduction of information can be accomplished by applying to the end portion of the stripe-like magnetic section 6, a pulse magnetic field of predetermined intensity perpendicular to the surface of the substrate, and although not shown, as pulse magnetic field applying means for recording and reproduction, conductor patterns for the supply of pulses are formed on the surface of the magnetic thin film 4 in predetermined, positional relationship with the stripe-like magnetic section 6.

In the Bloch line memory as described above, the formation of the potential well for the pair of Bloch lines is accomplished by providing periodic regular patterns on the surface of the magnetic thin film so as to cross the magnetic wall.

Figure 2:
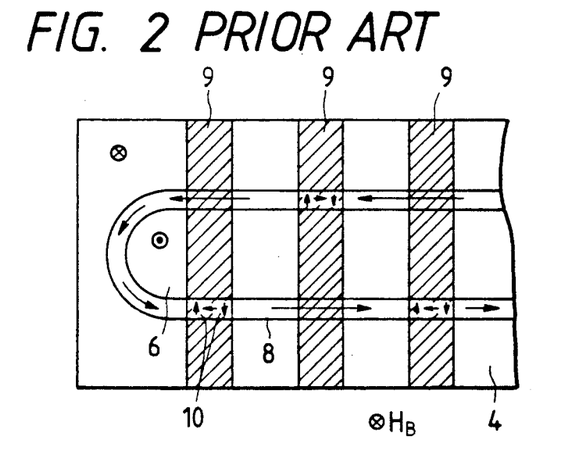
FIG. 2 is a fragmentary plan view of a prior art Bloch line memory and shows patterns for forming potential wells.

FIG. 2 of the accompanying drawings is a fragmentary plan view of the Bloch line memory showing an example of such patterns.

In FIG. 2, a number of line-like patterns 9 extending across the stripe-like magnetic section 6 and parallel to one another are provided on the surface of the magnetic thin film 4. These patterns each comprise a layer of a conductor such as Cr, Al, Au or Ti, the width thereof is, for example, of the order of 0.5 μm and the arrangement pitch thereof is, for example, of the order of 1 μm. By magnetic strain based on the formation of such pattern-like conductor layers, potential wells can be formed in the magnetic wall 8 and moreover, the arrangement thereof can be made regular and periodic. As the patterns 9, besides the above-mentioned conductor layers, use may be made of magnetic material layers or ions such as H ions, He ions or Ne ions driven into the vicinity of the surface of the magnetic thin film 4 in the form of the patterns. Also, potential wells formed by these patterns are symmetrical with respect to the direction of transfer of the Bloch lines indicated by arrows.

Figure 3:
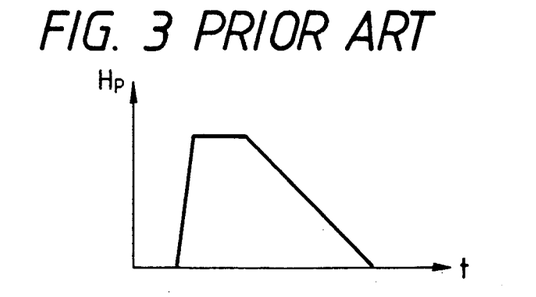
FIG. 3 is a graph showing the wave form of a pulse magnetic field used in the conventional Bloch line transfer.

Now, transfer of the Bloch lines is accomplished by applying a pulse magnetic field perpendicular to the film surface of the magnetic thin film 4, and moving the Bloch lines to the adjacent potential well by utilization of precessional movement of magnetization caused thereby. At this time, an asymmetrical pulse magnetic field as shown in FIG. 3 of the accompanying drawings is used as the perpendicular pulse magnetic field $H_P$ to thereby irreversibly transfer the Bloch lines in a particular direction.

As described above, in the conventional Bloch line transfer, utilization is made of the transient response characteristic of the magnetization by the application of a perpendicular pulse magnetic field and therefore, there arises a problem that if the wave form of the pulse magnetic field is slightly disturbed or the magnetic thin film 4 has a defect, accurate transfer of the Bloch lines becomes difficult.

SUMMARY OF THE INVENTION

The present invention has been made in view of the above-noted problem peculiar to the prior art and the object thereof is to provide a Bloch line transfer method which can always accurately transfer Bloch lines.

To achieve the above object, the present invention provides a method of transferring Bloch lines present in the magnetic wall of a magnetic section formed in a magnetic thin film along said magnetic wall, characterized by distributing a predetermined soft magnetic material layer pattern on said magnetic thin film, imparting to said pattern magnetization parallel to the film surface of said magnetic thin film to thereby form a potential well in said magnetic thin film, positioning said Bloch lines in said potential well, varying the direction of magnetization of said pattern in a plane parallel to the film surface to thereby move the potential well along the magnetic wall, thereby transferring the Bloch lines.

In the present invention, the potential well is a place which forms an extremal value of magnetic potential formed in at least the magnetic wall portion of the magnetic thin film, and refers to a place having the ability to trap the Bloch lines (a pair).

Further features and a specific form of the present invention will hereinafter be described in detail.

DESCRIPTION OF THE PREFERRED EMBODIMENT

A specific embodiment of the present invention will hereinafter be described with reference, to the drawings.

Figure 4:
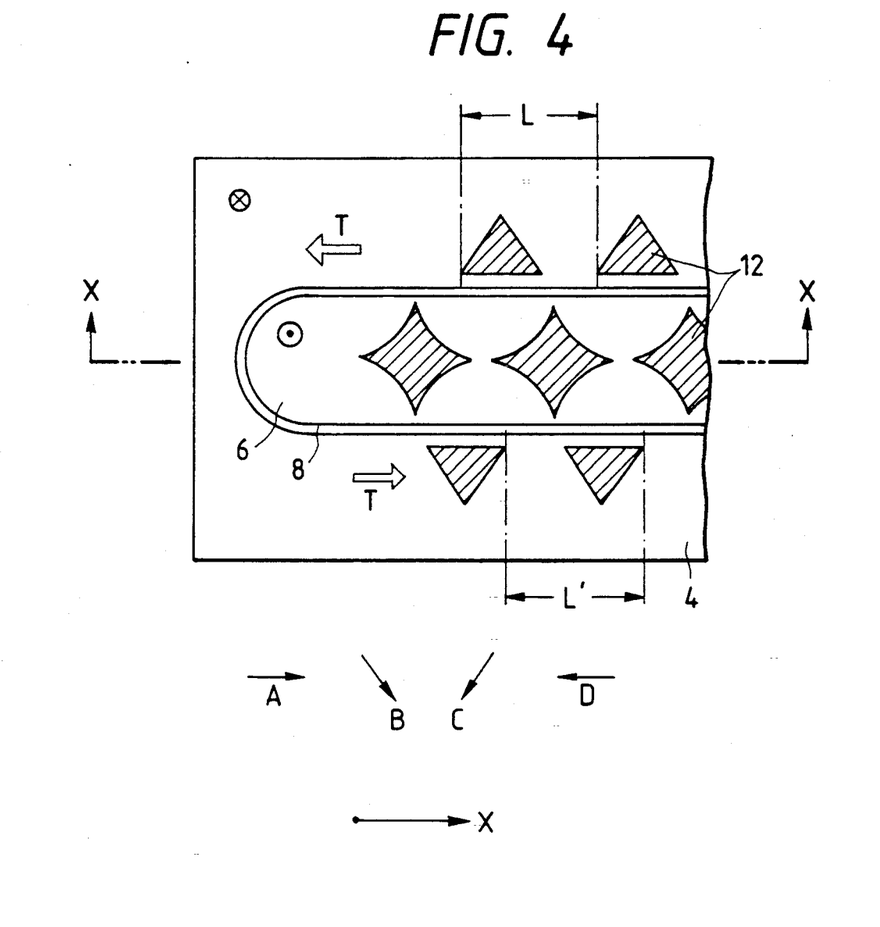
FIG. 4 is a fragmentary plan view of a Bloch line memory using the transfer method of the present invention.
Figure 5:
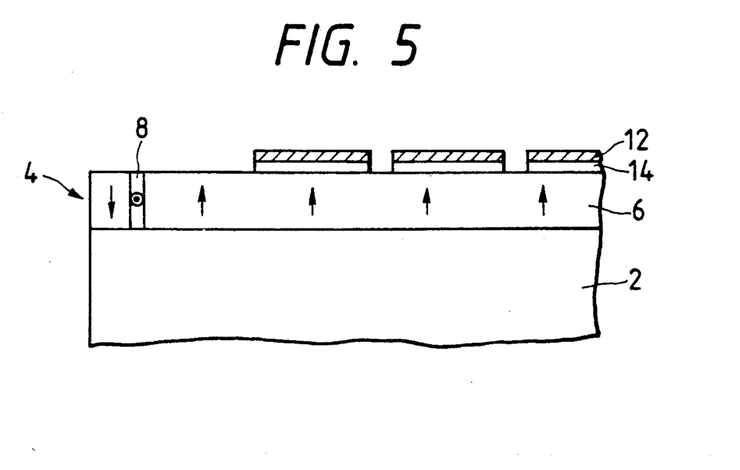
FIG. 5 is a cross-sectional view of the portion X—X of the Bloch line memory shown in FIG. 4.
Figure 6A:
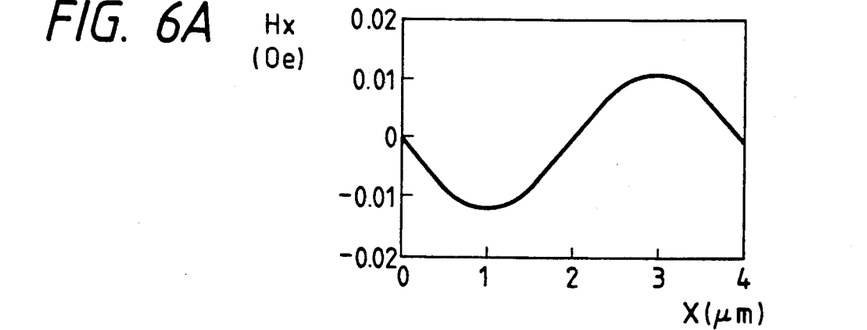
FIGS. 6A–6D illustrate a variation in the X-direction component $H_X$ of a magnetic field produced in the magnetic wall.
Figure 6B:
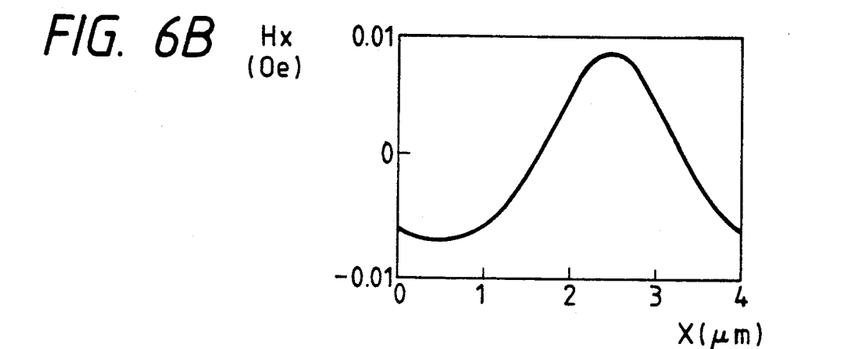
Figure 6C:
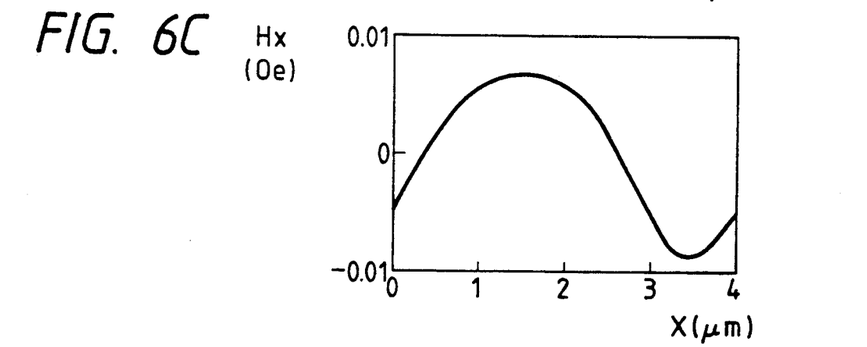
Figure 6D:
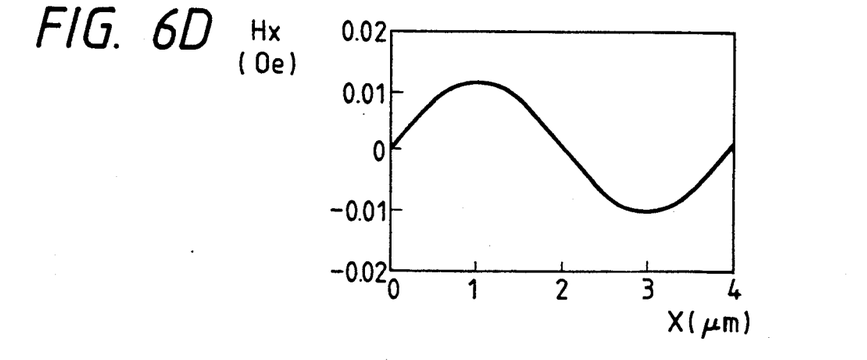

FIG. 4 is a fragmentary plan view showing an embodiment of a Bloch line memory using the transfer method according to the present invention, and FIG. 5 is a cross-sectional view of the portion X—X of FIG. 4.

In these figures, reference numeral 2 designates a non-magnetic garnet substrate and reference numeral 4 denotes a magnetic garnet thin film. A magnetic section 6 of a stripe-like planar shape is formed in the magnetic garnet thin film 4. Reference numeral 8 designates a magnetic wall around the stripe-like magnetic section 6. These are similar to those described above in connection with FIG. 1.

The direction of magnetization in the stripe-like magnetic section 6 is upward, and the direction of magnetization in that portion of the magnetic thin film 4 which is outside the magnetic section 6 is downward. A downward bias magnetic field is applied from the outside.

A pattern comprising soft magnetic material layers 12 is distributed on the surface of the magnetic thin film 4. The soft magnetic material may be, for example, a permalloy alloy. In the present embodiment, spacer layers 14 intervene between the soft magnetic material layers 12 and the, magnetic thin film 4. The spacer layers 14 may be formed of a non-magnetic material such as $SiO_2$.

Description will now be made of the transfer of the Bloch lines in the present embodiment FIGS. 6A–6D show a variation (potential) in the component $H_X$ of a magnetic filed in the X direction caused in the portion L' of the magnetic wall 8 on the basis of the magnetization induced in the soft magnetic material layers 12 when in FIG. 4, an in-surface magnetic field rotating clockwise in the film surface of the magnetic thin film 4 as shown by A→B→C→D is applied. FIGS. 6A–6D show $H_X$ when the directions of the in-surface magnetic field are A, B, C and D, respectively, in FIG. 4. Here, it has been assumed that the magnetization of the soft magnetic material layers 12 is 800 emu/cc, the thickness of the soft magnetic material layers 12 is 8000 Å and the thickness of the spacer layers 14 is 2 μm. The spacer layers 14 are used to adjust the ratio between that component of the magnetic field formed in the magnetic thin film 4 on the basis of the magnetization in the soft magnetic material layer 12 which is in a direction perpendicular to the film surface and that component of the magnetic field which is in a direction parallel to the film surface, and this ratio is adjusted by controlling the thickness of the spacer layers 14, whereby stabilization of the Bloch lines can be achieved.

As can be seen from FIGS. 6A–6D, as the direction of the magnetic field rotates clockwise, the maximum value position and the minimum value position of $H_X$ gradually move leftward. As shown in FIGS. 1 and 2, the pair of Bloch lines have magnetization in the X direction intermediately thereof and therefore, become stable at the maximum value position or the minimum value position of the $H_X$ and are successively moved leftward with the movement of the extremal value (potential well), whereby the transfer of the Bloch lines is accomplished.

In FIG. 4, on the side opposed to the portion L' of the magnetic wall 8, the pattern of the soft magnetic material layers 12 is converse to that on the side of the portion L and therefore, in the portion L' of the magnetic wall 8, the direction of movement of the extremal value position of $H_X$ by the application of the clockwise in-surface rotating magnetic field is rightward and after all, the extremal value moves counter-clockwise over the entire magnetic wall 8 as indicated by arrow T in FIG. 4. Thus the transfer of the Bloch lines is accomplished.

In the above-described embodiment, the pattern shown in FIG. 4 is used as the pattern of the soft magnetic material layers 12, but in the present invention, another pattern may also be used as long as it produces a magnetic potential of which the extremal value moves along the magnetic wall 8 toward the surface of the magnetic thin film in the magnetic wall 8, on the basis of the magnetization induced in the soft magnetic material layers 12 by the application of an in-surface rotating magnetic field. This pattern is formed so that when, as shown in FIG. 4, the pattern is divided into an upper and a lower pattern by the center line (line X—X) of the stripe-like magnetic section 6, the upper and lower patterns may assume similar shapes when rotated by 180°. Thereby, the potential well can move in one direction along the magnetic wall.

As described above, the potential for controlling the position of the Bloch lines of which the extremal value providing the potential well moves is formed along the magnetic wall and the transfer of the Bloch lines is accomplished by the in-surface rotating magnetic field and thus, stable and reliable transfer of the Bloch lines becomes possible.

Figure 7:
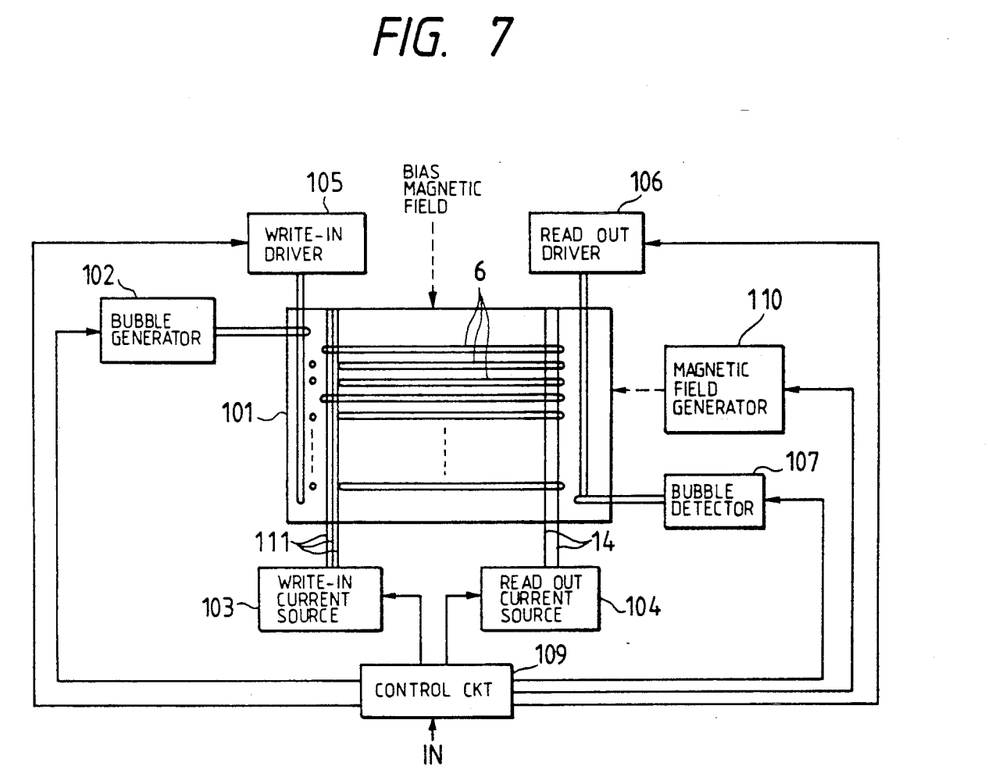
FIG. 7 is a schematic block diagram of a magnetic memory apparatus for transferring Bloch lines by the transfer method of the present invention.

FIG. 7 is a schematic block diagram showing an example of a magnetic memory apparatus for transferring a Bloch line which is an information carrier by the utilization of the transfer method of the present invention and effecting write-in and read-out of information.

In FIG. 7, reference numeral 101 designates a Bloch line memory substrate. On the substrate 101, as shown, a plurality of stripe-like magnetic sections 6 are arranged at a predetermined pitch in a direction orthogonal to the lengthwise direction of the stripe-like magnetic sections. A pattern comprising soft magnetic material layers as shown in FIG. 4 is distributed on the magnetic thin film including the stripe-like magnetic sections 6, and the soft magnetic material layers are magnetized in a predetermined direction by the action of an in-surface magnetic field which will be described later, and a predetermined magnetic potential is formed on the magnetic thin film, particularly, the magnetic wall of the stripe-like magnetic sections 6. Bloch lines are positioned in the potential well in the potential, and record information is stored as a time-serial signal shown by the distribution of the Bloch lines.

Reference numeral 102 designates a magnetic bubble generator which generates magnetic bubbles in a time-serial fashion in accordance with input information. The magnetic bubbles generated time-serially are successively transferred to the end position of the corresponding stripe-like magnetic section 6 by a write-in driver 105. These magnetic bubbles are used for the write-in of the Bloch lines.

On the other hand, reference numeral 106 denotes a read-out driver which converts the Bloch lines into magnetic bubbles for the purpose of reproducing the information, and thereafter transfers these magnetic bubbles to a bubble detector 107.

The bubble detector 107 detects the magnetic bubbles transferred thereto by the read-out driver 106, by the utilization of the magnetic resistance effect or the like, and outputs a time-serial (electrical) signal corresponding to the record information.

Reference numeral 103 designates a write-in current source for supplying a current to write-in conductors 111 when writing the Bloch lines into the end portion of each stripe-like magnetic section 6, and reference numeral 104 denotes a read-out current source for supplying a current to read-out conductors 114 when reading out the Bloch lines in the end portion of each stripe-like magnetic section 6.

Reference numeral 110 designates an in-surface rotating magnetic field generator which forms a magnetic field parallel to the film surface of the magnetic thin film of the Bloch line memory substrate 101 and also varies the direction of this magnetic field as described in connection with FIG. 4. That is, it rotates the direction of the magnetic field to thereby move the potential well formed in the magnetic wall along the magnetic wall, thereby accomplishing the transfer of the Bloch lines.

Reference numeral 109 denotes a control circuit which controls the drivers 105, 106, the generators 102, 110, the detector 107 and the sources 103, 104 in accordance with an input signal IN.

A method of forming Bloch lines in the magnetic wall of the end portions of the stripe-like magnetic sections 6 in the magnetic memory apparatus of FIG. 7 and a method of converting the Bloch lines in the end portions of the stripe-like magnetic sections 6 are described in detail in the aforementioned U.S. Pat. No. 4,583,200 and therefore, these methods need not be described herein.

The transfer of the Bloch lines (a pair) by the magnetic field generator 110 and the write-in of the Bloch lines by the write-in conductors 111 or the read-out of the Bloch lines by the read-out conductors 114 are executed in synchronism with each other by the control circuit 109. By transferring the Bloch lines by the transfer method of the present invention, the Bloch lines (a pair) can be accurately moved and the performance in recording/reproduction of information is greatly improved.

What is claimed is:

1. A transfer method for transferring a pair of Bloch lines present in a magnetic wall of a magnetic domain formed in a magnetic thin film along the magnetic wall, the transfer method comprising the steps of:

distributing predetermined soft magnetic patterns on the magnetic thin film in the magnetic domain and in regions outside of the magnetic domain, such that upper and lower patterns divided by a center line of the magnetic domain have similar shapes when rotated by 180 degrees;

applying a magnetic field to the magnetic patterns, parallel to the film surface of the magnetic thin film for generating a potential well, movable along the magnetic wall, in the magnetic thin film;

trapping the Bloch lines in the potential well; and rotating the direction of the magnetic field applied to the soft magnetic patterns in said applying step in a plane parallel to the film surface for moving the potential well along the magnetic wall and for transferring the Bloch lines trapped in the potential well in said trapping step.

2. A transfer method according to claim 1, wherein said step of distributing comprises forming the soft magnetic patterns on a spacer layer of a predetermined thickness formed on the magnetic thin film.

3. A transfer method according to claim 2, wherein the spacer layer comprises $SiO_2$.

4. A transfer method according to claim 1, wherein the distributing step for distributing the soft magnetic layers comprises forming, by a plurality to soft magnetic layers, a pattern of a triangle and a rhombus, the rhombus soft magnetic layers being provided on the magnetic domain and the triangle soft magnetic layers being provided outside of to the magnetic domain between the magnetic wall and the magnetic section.

5. A Bloch line memory for effecting recording/reproduction of information by a pair of Bloch lines present in a magnetic wall of a magnetic domain formed in a magnetic thin film, said memory comprising:

predetermined soft magnetic patterns distributed on the film in the magnetic domain and in regions outside of the magnetic domain, such that upper and lower patterns divided by a center line of the magnetic domain have similar shapes when rotated by 180 degrees;

magnetic field applying means for applying a magnetic field to said soft magnetic patterns parallel to the film surface of the magnetic thin film; and a potential well, formed in the magnetic thin film by the magnetized soft magnetic patterns, being moved along the magnetic wall by rotating the direction of the magnetic field by said applying means, said potential well trapping Bloch lines and wherein the Bloch lines trapped in said potential well are transferred by the movement of said potential well.

6. A Bloch line memory according to claim 5, wherein said magnetic thin film comprises a spacer layer formed thereon, and said soft magnetic material patterns are formed on said spacer layer.

7. A Bloch line memory according to claim 6, wherein said spacer layer comprises $SiO_2$.

8. A Bloch line memory according to claim 5, wherein said soft magnetic patterns comprise a plurality of soft magnetic layers forming a pattern of a triangle and a rhombus, the rhombus soft magnetic layers being provided on the magnetic domain and the triangle soft magnetic layers being provided outside of the magnetic domain between the magnetic wall and the magnetic domain.

9. A transfer method for transferring a pair of Bloch lines present in a magnetic wall of a magnetic domain formed in a magnetic thin film along the magnetic wall, said transfer method comprising the steps of:

distributing soft magnetic patterns on the magnetic thin film for forming a potential well along the magnetic wall on the magnetic thin film by applying a magnetic field to the soft magnetic patterns parallel to the film surface of the magnetic thin film, for moving the potential well along the magnetic wall by rotating the magnetic field in a plane parallel to the film surface of the magnetic thin film, the soft magnetic patterns being distributed in the magnetic domain and in regions outside of the magnetic domain, such that upper and lower patterns divided by a center line of the magnetic domain have similar shapes when rotated by 180 degrees;

trapping the Bloch lines in the potential well by applying a magnetic field to the soft magnetic patterns parallel to the film surface of the magnetic thin film; and transferring the Bloch lines contained in the potential well by rotating the magnetic field in a plane parallel to the film surface for moving the potential well.

10. A transfer method for transferring Bloch lines, present in a potential wall generated along a magnetic wall of a magnetic domain of a magnetic thin film, along the magnetic wall, the transfer method comprising the steps of:

generating the potential well by distribution a plurality of soft magnetic patterns on the magnetic thin film in the magnetic domain and in regions outside of the magnetic domain, such that upper and lower patterns divided by a center line of the magnetic domain have similar shapes when rotated by 180 degrees; and transferring the Bloch lines by rotating an in-plane magnetic field applied to the soft magnetic patterns to thereby move the potential well.

11. A transfer method according to claim 10, wherein the step of generating the potential well comprises forming the soft magnetic patterns on a surface of the magnetic thin film.

12. A transfer method according to claim 10, wherein the step of generating the potential well comprises forming, by a plurality of soft magnetic patterns, a pattern of a triangle and a rhombus, the rhombus soft magnetic patterns being provided on the magnetic domain and the triangle soft magnetic patterns being provided outside of the magnetic domain between the magnetic wall and the magnetic section.

13. A transfer method according to claim 10, wherein the soft magnetic patterns include a plurality of soft magnetic layers, and further comprising distributing the soft magnetic layers free from intersection with the magnetic wall inside and outside of the magnetic domain.

14. A transfer method for transferring Bloch lines, present in a potential well generated along a magnetic wall of a magnetic domain of a magnetic thin film, along the magnetic wall, the transfer method comprising the steps of:

distributing a plurality of soft magnetic patterns to generate a continuously moving potential well, which moves in accordance with a rotation of magnetization of the patterns, the soft magnetic patterns being distributed in the magnetic domain and in regions outside of the magnetic domain, such that upper and lower patterns divided by a center line of the magnetic domain have similar shapes when rotated by 180 degrees; and transferring the Bloch lines by rotating an in-plane magnetic field applied to the soft magnetic patterns to thereby move the potential well.

15. A transfer method according to claim 14, wherein the step of distributing the soft magnetic patterns comprises forming the patterns on a surface of the magnetic thin film.

16. A transfer method according to claim 14, wherein the step of distributing the soft magnetic patterns comprises forming, by a plurality of soft magnetic patterns, a pattern of a triangle and a rhombus, the rhombus soft magnetic patterns being provided on the magnetic domain and the triangle soft magnetic patterns being provided outside of the magnetic domain between the magnetic wall and the magnetic domain.

17. A method according to claim 14, wherein the soft magnetic patterns include a plurality of soft magnetic layers, and further comprising distributing the soft magnetic layers free from intersection with the magnetic wall inside and outside of the magnetic domain.

18. A method according to claim 14, wherein the magnetic field applied in the transferring step is an in-plane magnetic field.

19. A Bloch line memory device for effecting recording/reproduction of information by a pair of Bloch lines trapped by a potential well generated along a magnetic wall of a magnetic domain of a magnetic thin film, said memory device comprising:

a plurality of soft magnetic patterns distributed on the magnetic thin film to generate a continuously moving potential well, which moves in accordance with a rotation of magnetization of the patterns, the soft magnetic patterns being distributed in the magnetic domain and in regions outside of the magnetic domain such that upper and lower patterns divided by a center line of the magnetic domain have similar shapes when rotated by 180 degrees; and moving means for moving the potential well by rotating an in-plane magnetic field applied to the soft magnetic patterns.

20. A memory device according to claim 19, wherein said soft magnetic patterns are formed on a surface of the magnetic thin film.

21. A memory device according to claim 19, wherein said soft magnetic patterns comprise a plurality of soft magnetic patterns arranged in a pattern of a triangle and a rhombus, the rhombus soft magnetic patterns being provided on the magnetic domain and the triangle soft magnetic patterns being provided outside of the magnetic domain between the magnetic wall and the magnetic domain.

22. A memory device according to claim 19, wherein said soft magnetic patterns comprise a plurality of soft magnetic layers, said soft magnetic layers being distributed free from intersection with the magnetic wall inside and outside of the magnetic domain.

23. A memory device according to any of claim 19, wherein said magnetic field comprises an in-plane magnetic field.

24. A memory device according to claim 20, wherein said magnetic field comprises an in-plane magnetic field.

25. A memory device according to claim 21, wherein said magnetic field comprises an in-plane magnetic field.

26. A memory device according to claim 22, wherein said magnetic field comprises an in-plane magnetic field.

27. A transfer method for transferring Bloch lines present in a potential well generated along a magnetic wall of a magnetic thin film, the Bloch lines being transferred along the magnetic wall, the transfer method comprising the steps of:

distributing a plurality of soft magnetic patterns on the magnetic thin film free from intersection with the magnetic wall inside and outside of the magnetic domain, to generate a continuously moving potential well, which moves in accordance with a rotation of magnetization of the patterns, the soft magnetic patterns being distributed such that upper and lower patterns divided by a center line of the magnetic domain have similar shapes when rotated by 180 degrees; and transferring the Bloch lines by rotating an in-plane magnetic field applied to the soft magnetic patterns.

28. A transfer method according to claim 27, wherein the step of distributing the soft magnetic patterns comprises forming the patterns on a surface of the magnetic thin film.

29. A transfer method according to claim 27, wherein the step of distributing the soft magnetic patterns comprises forming, by a plurality of soft magnetic patterns, a pattern of a triangle and a rhombus, the rhombus soft magnetic patterns being provided on the magnetic domain and the triangle soft magnetic patterns being provided outside of the magnetic domain between the magnetic wall and the magnetic domain.

30. An information recording method including forming Bloch lines in a magnetic wall of a magnetic domain of a magnetic thin film, in accordance with information to be recorded, and transferring the formed Bloch lines along the magnetic wall, said information recording method comprising the steps of:

distributing a plurality of soft magnetic patterns, each having a predetermined shape, on the magnetic thin film so that the patterns indicate respective predetermined positional relationships, thereby allowing the Bloch lines to move in accordance with a rotation of magnetization of the plurality of soft magnetic patterns, the soft magnetic patterns being distributed in the magnetic domain and in regions outside of the magnetic domain, such that upper and lower patterns divided by a center line of the magnetic domain have similar shapes when rotated by 180 degrees; and moving the Bloch lines by rotating an in-plane magnetic field applied to the soft magnetic patterns to rotate the magnetization of the plurality of soft magnetic patterns.

31. A transfer method according to claim 30, wherein the step of distributing the soft magnetic patterns comprises forming, by a plurality of soft magnetic layers, a pattern of a triangle and a rhombus, the rhombus soft magnetic layers being provided on the magnetic domain and the triangle soft magnetic layers being provided outside of the magnetic domain between the magnetic wall and the magnetic domain.

32. An information reproducing method including transferring Bloch lines in a magnetic wall of a magnetic domain of a magnetic thin film, along the magnetic wall, and detecting the transferred Bloch lines to reproduce information, said information reproducing method comprising the steps of:

distributing a plurality of soft magnetic patterns, each having a predetermined shape, on the magnetic thin film so that the patterns indicate respective predetermined positional relationships, thereby allowing the Bloch lines to move in accordance with a rotation of magnetization of the plurality of soft magnetic patterns, the soft magnetic patterns being distributed in the magnetic domain and in regions outside of the magnetic domain, such that upper and lower patterns divided by a center lien of the magnetic domain have similar shapes when rotated by 180 degrees; and moving the Bloch lines by rotating an in-plane magnetic field applied to the soft magnetic patterns to rotate the magnetization of the plurality of soft magnetic patterns.

33. A transfer method according to claim 32, wherein the step of distributing the soft magnetic patterns comprises forming, by a plurality of soft magnetic layers, a pattern of a triangle and a rhombus, the rhombus soft magnetic layers being provided on the magnetic domain and the triangle soft magnetic layers being provided outside of the magnetic domain between the magnetic wall and the magnetic domain.

34. A transfer method for transferring Bloch lines in a magnetic wall of a magnetic domain of a magnetic thin film, along the magnetic wall, said transfer method comprising the steps of:

distributing a plurality of soft magnetic patterns, each having a predetermined shape, on the magnetic thin film so that the patterns indicate respective predetermined positional relationships, thereby allowing the Bloch lines to move in accordance with a rotation of magnetization of the plurality of soft magnetic patterns, the soft magnetic patterns being distributed in the magnetic domain and in regions outside of the magnetic domain, such that upper and lower patterns divided by a center line of the magnetic domain have similar shapes when rotated by 180 degrees; and moving the Bloch lines by rotating an in-plane magnetic field applied to the soft magnetic patterns to rotate the magnetization of the plurality of soft magnetic patterns.

35. A transfer method according to claim 34, wherein the step of distributing the soft magnetic patterns comprises forming, by a plurality of soft magnetic layers, a pattern of a triangle and a rhombus, the rhombus soft magnetic layers being provided on the magnetic domain and the triangle soft magnetic layers being provided outside of the magnetic domain between the magnetic wall and the magnetic domain.

* * * * *

UNITED STATES PATENT AND TRADEMARK OFFICE
CERTIFICATE OF CORRECTION

PATENT NO. : 5,172,336          Page 1 of 2
DATED : December 15, 1992
INVENTOR(S) : Fumihiko Saito, et al.

It is certified that error appears in the above-identified patent and that said Letters Patent is hereby corrected as shown below:

ON THE COVER PAGE, ITEM [56] REFERENCES CITED

UNDER "OTHER PUBLICATIONS"

With respect to the Suzuki, et al. document, "Sep. 1985," should read --Sep. 1986,--.

COLUMN 1

Line 29, "duce" should read --duced--;
Line 50, "Ser. No." should read
--Ser. No. 434,538 filed November 8, 1989 which is a continuation of applicant's U.S. Application Serial No. 125,824 filed November 23, 1987, now abandoned which is a continuation of applicant's U.S. Application Serial No.--.

COLUMN 3

Line 8, "predetermined ," should read --predetermined--.

COLUMN 4

Line 38, "reference," should read --reference--; and
Line 62, "the," should read --the--.

UNITED STATES PATENT AND TRADEMARK OFFICE
CERTIFICATE OF CORRECTION

PATENT NO. : 5,172,336
DATED : December 15, 1992
INVENTOR(S) : Fumihiko Saito, et al.

It is certified that error appears in the above-identified patent and that said Letters Patent is hereby corrected as shown below:

COLUMN 5

Line 33, "L'" should read --L--.

COLUMN 7

Line 41, "to" should read --of--; and
    Line 45, "to" should be deleted.

COLUMN 8

Line 41, "wall" should read --well; and
    Line 45, "distribution" should read --distributing--.

COLUMN 11

Line 24, "lein" should read --line--.

Signed and Sealed this

First Day of February, 1994

Attest:

BRUCE LEHMAN

Attesting Officer      Commissioner of Patents and Trademarks